United States Patent
Vallêra et al.

(10) Patent No.: US 7,799,131 B2
(45) Date of Patent: Sep. 21, 2010

(54) METHOD FOR THE GROWTH OF SEMICONDUCTOR RIBBONS

(75) Inventors: António Vallêra, Lisbon (PT); João Serra, Sassoeiros (PT); Jorge Maia Alves, Oeiras (PT); Miguel Brito, Praga (PT); Roberto Gamboa, Olhalvo (PT); João Henriques, Ericeira (PT)

(73) Assignee: Faculdade de Ciencias Da Universidade de Lisboa, Lisbon (PT)

( * ) Notice: Subject to any disclaimer, the term of this patent is extended or adjusted under 35 U.S.C. 154(b) by 481 days.

(21) Appl. No.: 11/578,378

(22) PCT Filed: Apr. 15, 2004

(86) PCT No.: PCT/PT2004/000007

§ 371 (c)(1),
(2), (4) Date: Oct. 13, 2006

(87) PCT Pub. No.: WO2005/100644

PCT Pub. Date: Oct. 27, 2005

(65) Prior Publication Data

US 2007/0241481 A1 Oct. 18, 2007

(51) Int. Cl.
*C30B 13/00* (2006.01)
(52) U.S. Cl. .............. 117/30; 117/13; 117/23; 117/24; 117/25; 117/26; 117/33; 117/37; 117/47; 117/48; 117/49; 117/200; 117/205; 117/211; 117/219; 117/220; 117/922
(58) Field of Classification Search ............ 23/301 SP; 117/23, 47, 48, 49, 13, 24, 25, 26, 30, 33, 117/37, 200, 205, 211, 219, 220, 922
See application file for complete search history.

(56) References Cited

U.S. PATENT DOCUMENTS 3,935,058 A  1/1976  Kuhlmann-Schafer (Continued)

FOREIGN PATENT DOCUMENTS

JP   58-049689 A   2/1983

(Continued)

OTHER PUBLICATIONS

Gamboa, R.M. et al., "Silicon tubes by a closed molten zone: a characterization study", Solar Energy Materials and Solar Cells, Apr. 2002, vol. 72, 173-181, No. 1-4, Elsevier Science Publishers, Amsterdam, NL.

*Primary Examiner*—Robert M Kunemund
*Assistant Examiner*—Matthew J Song
(74) *Attorney, Agent, or Firm*—Sughrue Mion, PLLC

(57) ABSTRACT

The present invention provides a method for the continuous production of semiconductor ribbons by growth from a linear molten zone. The creation of the molten zone is achieved by application of an electric current, direct or alternating, parallel to the surface of the ribbon and perpendicular to the direction of growth, and intense enough to melt the said material, preferably using electrodes of the said material. The molten zone is fed by transference of the material, in the liquid state, from one or more reservoirs, where melting of the feedstock occurs. Preferably, the said electrodes and the said reservoir (s) are only constituted by the said material, thus avoiding contamination by foreign materials. The present invention is applicable, for example, in the industry of silicon ribbons production for photovoltaic application.

9 Claims, 2 Drawing Sheets

U.S. PATENT DOCUMENTS

Figure 1:
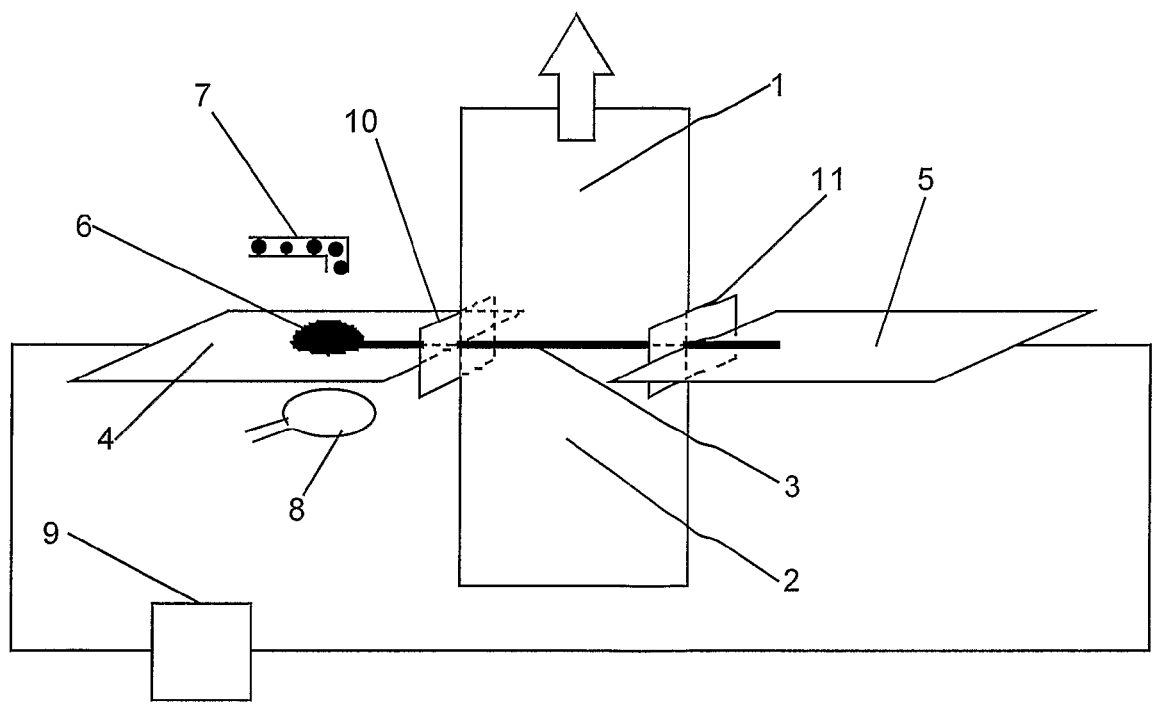

| | | |
|---|---|---|
| 3,960,511 A | 6/1976 | Kuhlmann-Schäfer |
| 4,118,197 A | 10/1978 | Mackintosh et al. |
| 4,481,235 A | 11/1984 | Foell et al. |
| 4,575,401 A | 3/1986 | Pinkhasov |
| 4,661,200 A | 4/1987 | Sachs |
| 4,690,797 A | 9/1987 | Eyer et al. |
| 4,749,438 A | 6/1988 | Bleil |
| 5,108,720 A | 4/1992 | Bourbina et al. |
| 6,787,088 B2 * | 9/2004 | Parce et al. ............. 264/241 |
| 2002/0139672 A1 * | 10/2002 | Kasai et al. ............. 204/453 |

FOREIGN PATENT DOCUMENTS

JP    5-043376 A    2/1993

* cited by examiner

METHOD FOR THE GROWTH OF SEMICONDUCTOR RIBBONS

1. FIELD OF THE INVENTION

The present invention relates to a process for the continuous growth of ribbons of semiconductor material from a melt of the same material, and more particularly to ribbon growth from a molten zone.

2. STATE OF THE ART

The crystallization of a semiconductor material into a ribbon, or foil, directly from the melt, is attractive because it eliminates the kerf loss and the cost associated to the operation of cutting an ingot into wafers. Several methods have been proposed for the continuous, or semi continuous, growth of semiconductor ribbons. Few, however, have proven industrial viability; there are two currently in production (derived from U.S. Pat. Nos. 4,118,197 and 4,661,200).

Some of the problems are growth stability, high energy and consumables use, and low quality of the produced material, due in particular to contamination by contact of the molten semiconductor with foreign materials, such as the ones used in crucibles, or in other furnace elements, for instance ribbon shapers.

Some of the proposed methods avoid the use of a crucible by crystallizing the ribbon from a molten zone (for instance, U.S. Pat. No. 4,690,797); these, however, use the starting material in a pre-shaped form, or pre-ribbon, and the added step for obtaining this from feedstock makes them less attractive. Only for ingot growth have some possibly crucibleless methods described continuous feeding of a melt (in the form of a molten cap) directly with feedstock, such as cited by JP5043376, in 1993, and JP6199589, in 1994, where it was shown how to grow a silicon ingot from a molten cap fed with granular material or powder, respectively.

Concerning the techniques used for heating a semiconductor material to a melt, Joule effect due to electrical currents in the material to be crystallised itself (both in the solid and molten phases) is among the most used. Most techniques use induced currents produced by an external coil; a few use electric currents injected by electrodes. Such is the case of the method described in U.S. Pat. No. 3,960,511, in which current is applied transversely, along all the length of the ribbon forming melt, by electrodes acting also as shapers; and of that described in U.S. Pat. No. 3,935,058, where increased heat control is obtained in the melting zone of a zone melting process utilizing an electric current passed longitudinally through the charge, to melt the charge.

3. SUMMARY OF THE INVENTION

The present invention provides a method for the continuous production of ribbons of semiconductor material by growth from a linear molten zone. The creation of this molten zone, linear in the sense that it is very much longer than wide or thick, is achieved by application of an electric current, direct or alternating, parallel to the surfaces of the ribbon and perpendicular to the direction of growth, and intense enough to melt the said material, preferably using electrodes of the said material. The molten zone is fed by transference of the said material, in the liquid state, from one or more reservoirs where melting of the feedstock occurs. Preferably, the said reservoir, or reservoirs, are constituted only by the said material, thus avoiding contamination of the melt by foreign materials.

The present invention is applicable, for example, in the production of silicon ribbons for the photovoltaic solar cell industry.

4. BRIEF DESCRIPTION OF THE DRAWINGS

Figure 2:
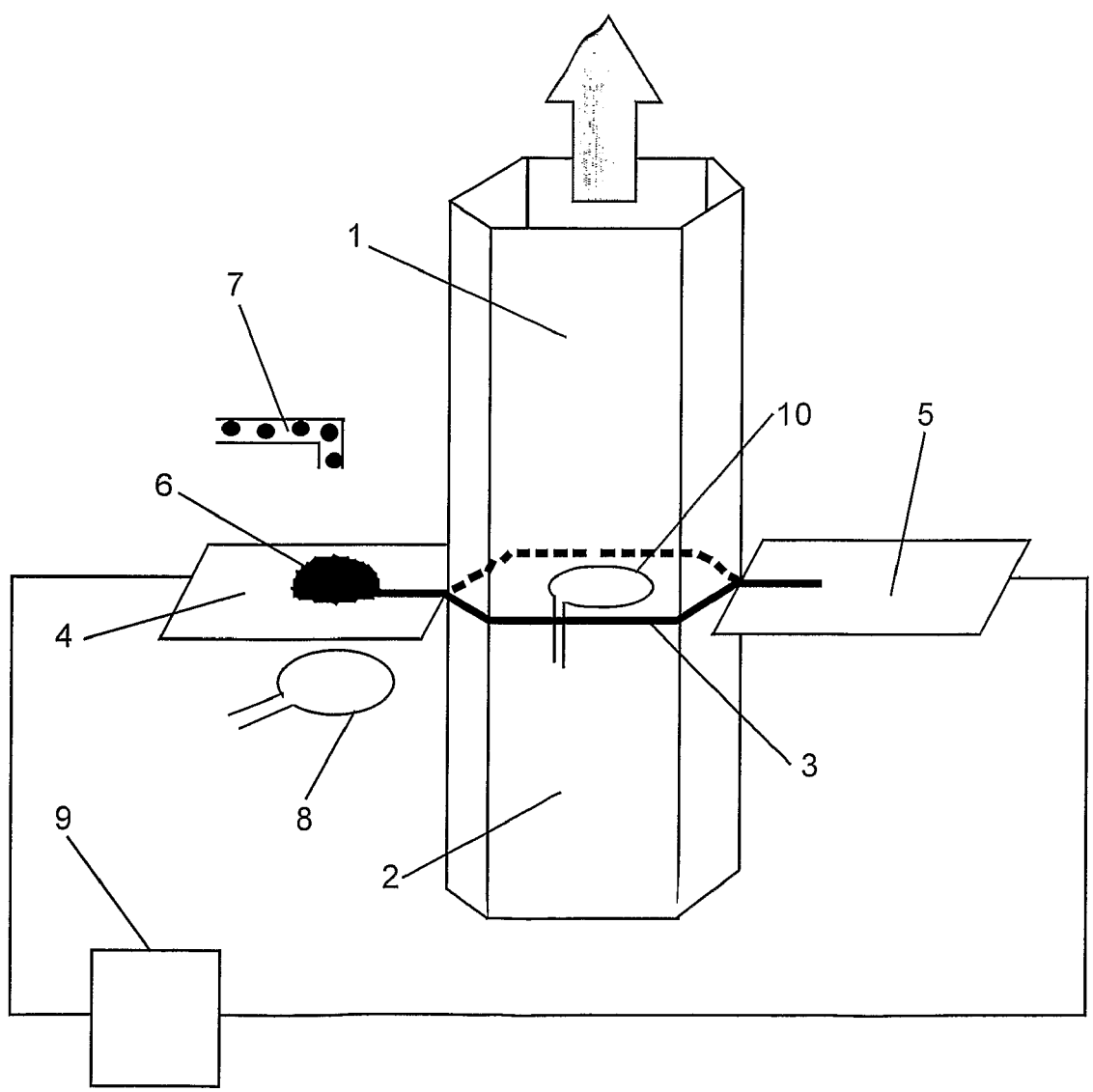

FIG. 1 is a perspective, schematic and simplified representation of an embodiment of the process in accordance with the present invention; and FIG. 2 is a perspective, schematic and simplified representation of another embodiment of the process in accordance with the present invention.

5. DESCRIPTION OF THE PREFERRED EMBODIMENTS

In the embodiment illustrated in FIG. 1, the ribbon of semiconductor material (1) is extracted from a linear molten zone (3) extending along the width of the supporting plate (2). The molten zone is created and kept using an electric current parallel to the surface of the ribbon (1) and perpendicular to the direction of growth of the said ribbon, indicated by the arrow in the drawing. The intensity of the said electric current must be high enough to melt the said material, thus producing the said molten zone. Use of direct current is preferred, although alternating current can also be used.

Preferably, a system of radiative pre-heating can be used to assist the formation of the molten zone. The electric current, generated by the current source (9), is applied through electrodes (4) and (5), preferably of the same material as the said ribbon.

A reservoir (6) of feedstock material in the liquid state is located in electrode (4). The reservoir is fed by feedstock, preferably in granular, or powder, form, that is continuously added to the reservoir by a guide (7). The reservoir (6) is heated, to keep a volume of material in the molten state, using preferably an induction coil (8). In alternative, the feedstock can be molten by other means, such as radiation.

The molten zone (3) extends to connect with the reservoir (6), and thus the said zone is fed by transference of the said molten material from the reservoir. Preferably, the said molten zone also extends out to the electrode (5).

A second reservoir connected to the prolongation of the molten zone on the electrode (5) can be used. This second reservoir, not shown in FIG. 1, may act as a second source of material to feed the molten zone or may act as a sink for extraction of existing impurities in the said molten material.

Preferably a pressure differential is applied between the reservoir of molten material (6) and the molten zone (3) in order to control the mass transference between the said reservoir and the said molten zone.

Preferably, elements (10) and (11) are used for stabilization of the edge of the ribbon and for conditioning mass transference. These elements are preferably located between the electrodes (4) and (5) and the ribbon (1) and supporting plate (2). Preferably these elements are of the same material as the ribbon.

One other embodiment of the present invention is illustrated in FIG. 2. This process is characterized by the molten zone (3) having substantially the form of a polygon.

The extracted material (1) has, in the particular case illustrated, the form of a hexagonal tube, which can later be cut longitudinally in order to produce ribbons of semiconductor material. The molten zone (3) is in this case created and kept by two electric currents, the first one generated by the current source (9) and applied by electrodes (4) and (5), and the second current generated by induction through induction coils (10). As previously, the molten zone is fed by a reservoir (6) where melting of the feedstock, continuously added to the reservoir by a guide (7), occurs. The material in the reservoir (6) is molten preferably using induction coils (8).

Having thus described a preferred embodiment of the present invention, it should be noted by those skilled in the art that the within disclosures are exemplary only and that various other alternatives, adaptations and modifications may be made within the scope of the present invention. Accordingly, the present invention is not limited to the specific embodiments as illustrated herein.

The invention claimed is:

1. A process for the growth of ribbons of a semiconductor material from a long, thin molten zone, having a length similar to the width of the said ribbon, comprising:
    (a) providing semiconductor material in a liquid state in one or more reservoirs, in which a feedstock of the said semiconductor material is molten;
    (b) transferring molten semiconductor material from said one or more reservoirs to said molten zone by means of a pressure differential applied between the said reservoir and the said molten zone;
    (c) the molten zone being a continuous film of liquid (i) suspended between a solid-liquid interface of the growing ribbon, on one side, and that of a supporting plate of the same material, on the opposite side, with two free lateral liquid-gas interfaces, so, that the liquid only contacts, along all its length, a solid phase of the said semiconductor material and no other substance, apart from the gas over its free surfaces, and (ii) created by an electric current, substantially parallel to the surface of the said ribbon and perpendicular to the growth direction of the said ribbon, passing in the semiconductor material with an intensity required at least to form a continuous suspended melt that constitutes the said molten zone.

2. A process in accordance with claim 1, in which the molten zone and adjacent solid semiconductor material, including the growing ribbon, are heated not only by an internal electric current but also by other complementary sources of heat, such as radiation, in order to achieve appropriate growth conditions.

3. A process in accordance with claim 1, where in the said semiconductor material is silicon.

4. A process in accordance with claim 1, wherein the said reservoir(s) are constituted of said semiconductor material.

5. A process in accordance with claim 1, wherein the electrodes that introduce said current are constituted of the said semiconductor material.

6. A process in accordance with claim 1, comprising:
    using a plate shaped element(s) to stabilize the edge of the ribbon and conditioning the transference of the liquid to or from the said molten zone.

7. A process in accordance with claim 6, in which the said element(s) are constituted of said semiconductor material.

8. A process in accordance with claim 1, wherein the said molten zone has the shape of an ellipse or a polygon.

9. An apparatus for the growth of a ribbon of semiconductor material from a molten zone comprising:
    a plate of semiconductor material;
    one or more reservoirs of said molten semiconductor material;
    a pair of electrodes extending to the edges of said plate;
    means connected to said electrodes for passing an electric current to form a floating molten zone in said plate and to develop a pressure differential capable of transferring said semiconductor material in a liquid state from said reservoirs to said floating molten zone; and
    means to draw a ribbon of semiconductor material from said floating molten zone while the molten zone continues to be heated by said electric current and replenished by said semiconductor material in the liquid state transferred from said reservoirs.

* * * * *